(12) United States Patent
Subramanian

(10) Patent No.: US 9,980,366 B2
(45) Date of Patent: May 22, 2018

(54) HIGH SPEED SIGNAL ROUTING TOPOLOGY FOR BETTER SIGNAL QUALITY

(71) Applicant: QUALCOMM Incorporated, San Diego, CA (US)

(72) Inventor: Yokesh Subramanian, Tamil Nadu (IN)

(73) Assignee: QUALCOMM Incorporated, San Diego, CA (US)

(*) Notice: Subject to any disclaimer, the term of this patent is extended or adjusted under 35 U.S.C. 154(b) by 336 days.

(21) Appl. No.: 14/595,175

(22) Filed: Jan. 12, 2015

(65) Prior Publication Data
US 2016/0205767 A1    Jul. 14, 2016

(51) Int. Cl.
| | |
|---|---|
| H05K 1/00 | (2006.01) |
| H05K 1/18 | (2006.01) |
| H05K 7/00 | (2006.01) |
| H05K 1/02 | (2006.01) |
| G11C 5/02 | (2006.01) |

(52) U.S. Cl.
CPC .......... *H05K 1/0213* (2013.01); *G11C 5/025* (2013.01); *H05K 1/025* (2013.01); *H05K 1/18* (2013.01); *H05K 1/0243* (2013.01); *H05K 1/0246* (2013.01); *H05K 1/0248* (2013.01); *H05K 2201/09227* (2013.01); *H05K 2201/09254* (2013.01)

(58) Field of Classification Search
USPC ................................................. 361/748, 761
See application file for complete search history.

(56) References Cited

U.S. PATENT DOCUMENTS

| | | | |
|---|---|---|---|
| 4,947,144 | A | 8/1990 | Le Nohaic |
| 6,573,757 | B1 | 6/2003 | Gallagher |
| 6,661,092 | B2 | 12/2003 | Shibata et al. |
| 6,784,526 | B1 | 8/2004 | Mezawa |
| 6,947,304 | B1 | 9/2005 | Yen |
| 7,245,145 | B2 | 7/2007 | Pax et al. |

(Continued)

FOREIGN PATENT DOCUMENTS

EP    2161890 A2    3/2010

OTHER PUBLICATIONS

International Search Report and Written Opinion—PCT/US2016/012912—ISA/EPO—dated Jul. 28, 2016

*Primary Examiner* — Andargie M Aychillhum
(74) *Attorney, Agent, or Firm* — Arent Fox, LLP and Qualcomm

(57) ABSTRACT

An apparatus including an output driver on a PCB and a number of chips on the PCB, the chips including a first chip and a second chip. The PCB includes a first transmission line connected to the output driver, a second transmission line connected to the first transmission line and the first chip, the second transmission line having a length greater than or equal to 10 times a length of the first transmission line, and a third transmission line connected to the first transmission line and the second chip, the third transmission line having a length greater than or equal to 10 times the length of the first transmission line. The second transmission line connects to the first chip without being coupled to a termination resistor on the PCB and the third transmission line connects to the second chip without being coupled to a termination resistor on the PCB.

16 Claims, 5 Drawing Sheets

(56) References Cited

U.S. PATENT DOCUMENTS

| | | |
|---|---|---|
| 7,411,806 B2 | 8/2008 | Funaba et al. |
| 7,535,321 B1 | 5/2009 | Degerstrom et al. |
| 7,746,095 B2 | 6/2010 | Pax et al. |
| 8,134,239 B2 | 3/2012 | Hiraishi et al. |
| 2007/0194968 A1 | 8/2007 | Sung et al. |
| 2011/0176345 A1* | 7/2011 | Chen .................... H05K 1/0286 365/51 |
| 2014/0341581 A1* | 11/2014 | Lent ........................ H04B 3/32 398/79 |

* cited by examiner

HIGH SPEED SIGNAL ROUTING TOPOLOGY FOR BETTER SIGNAL QUALITY

BACKGROUND

Field

The present disclosure relates generally to signal trace routing on a printed circuit board (PCB), and more particularly, to a high speed signal routing topology for better signal quality.

Background

As the demand for complex and high performance consumer electronic products (e.g., smart phones) continues to increase, manufacturers of such products are finding it challenging to meet such demand while maintaining low production costs. Therefore, there is a need for improved designs of such consumer electronic products to overcome these challenges.

SUMMARY

In an aspect of the disclosure, an apparatus includes an output driver on a PCB and a number of chips on the PCB. The chips include a first chip and a second chip. The PCB includes a first transmission line connected to the output driver and a second transmission line connected to the first transmission line and the first chip. The second transmission line has a length greater than or equal to 10 times a length of the first transmission line. The PCB further includes a third transmission line connected to the first transmission line and the second chip. The third transmission line has a length greater than or equal to 10 times the length of the first transmission line.

In an aspect of the disclosure, an apparatus includes a PCB. The PCB includes an output driver and a plurality of chips. The apparatus propagates a signal from the output driver through a first transmission line connected to the output driver. The apparatus propagates the signal from the first transmission line to a second transmission line connected to the first transmission line and a first chip of the plurality of chips. The second transmission line has a length greater than or equal to 10 times a length of the first transmission line. The apparatus propagates the signal from the first transmission line to a third transmission line connected to the first transmission line and a second chip of the plurality of chips. The third transmission line has a length greater than or equal to 10 times a length of the first transmission line.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Consumer electronic products typically implement PCBs having a number of layers. For example, consumer electronic products typically implement four layer PCBs, where two of the four layers are used for power and ground, and the remaining two layers are used for routing signal traces. The two layers used for routing signal traces are generally located on the top and bottom surfaces of the PCB. However, as the number and/or size of the electronic components on the top and bottom surfaces of the PCB increases, the usable area for routing signal traces on the PCB decreases. As such, if an adequate amount of area is not available on the PCB, more costly PCBs (e.g., PCBs having six or more layers) may need to be used.

In one scenario, when one or more signal traces (e.g., memory address lines) on a PCB need to branch out in order to provide a signal to multiple electronic components (e.g., memory chips), routing techniques such as balanced tree routing and fly-by routing, may be used. These techniques typically require voltage terminations (also referred to as $V_{TT}$) on the branched out signal traces to maintain signal quality. Each of these voltage terminations includes one or more resistors and additional signal trace routing, which may substantially reduce the usable area on the PCB. As such, manufacturers may need to implement PCBs having six or more layers to accommodate all of the necessary signal trace routing for a particular design, which may substantially increase the manufacturing costs of the consumer electronic products.

Figure 1:
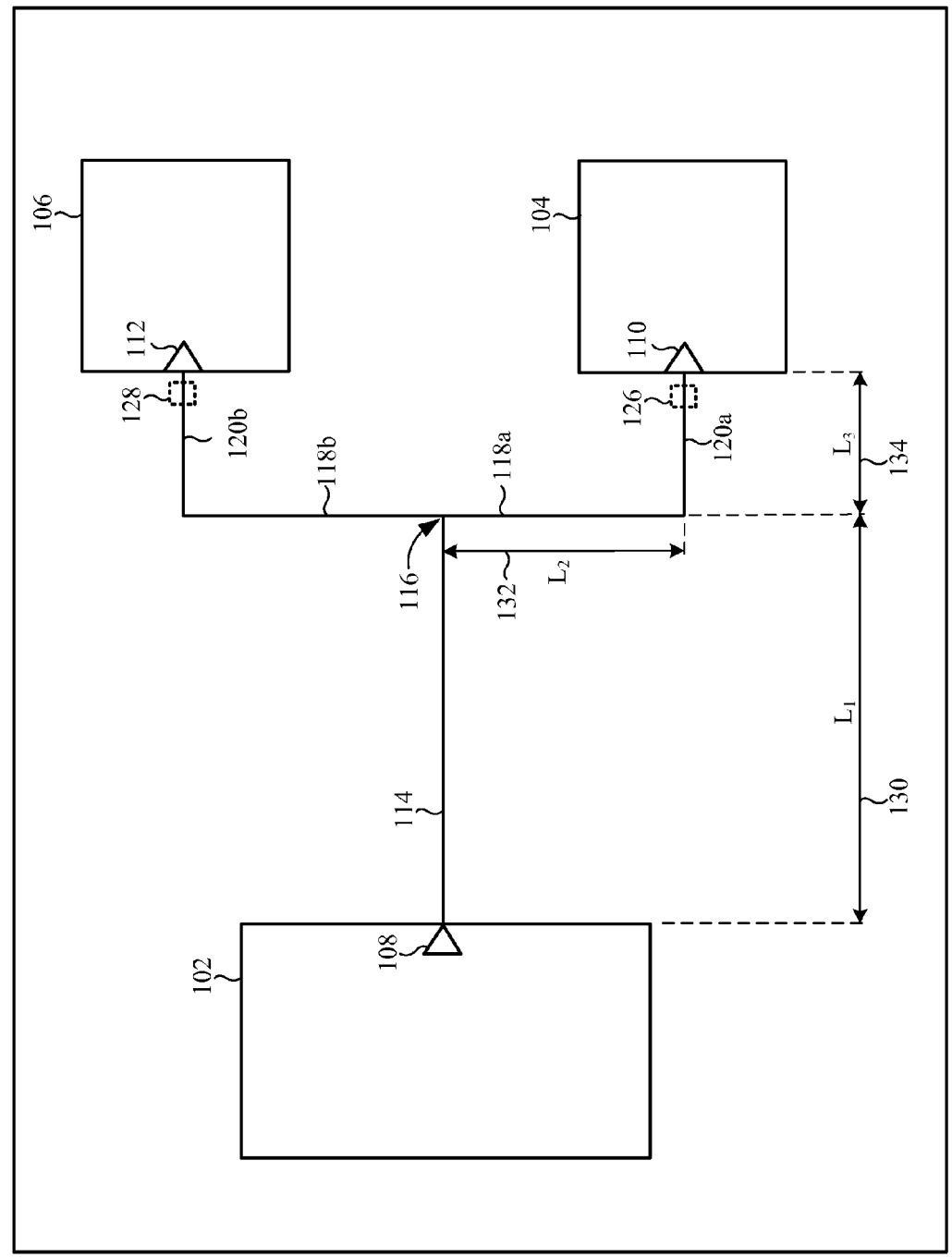
FIG. 1 is a diagram of a PCB illustrating signal trace routing in accordance with various aspects of the disclosure.

FIG. 1 is a diagram of a PCB 100 illustrating signal trace routing in accordance with various aspects of the disclosure. As shown in FIG. 1, PCB 100 includes chips 102, 104, and 106. As further shown in FIG. 1, chip 102 includes an output driver 108, and chips 104 and 106 include respective inputs 110 and 112. For example, chip 102 may be a system-on-a-chip (SOC) and chips 104 and 106 may each be a memory chip, such as a dynamic random-access memory (DRAM) chip. In such example, the output driver 108 of chip 102 may be an address line output configured to provide an address signal to both inputs 110, 112 of chips 104, 106. Accordingly, and as shown in FIG. 1, the signal trace 114 for carrying the output signal from the output driver 108 is configured to branch out at junction 116, such that a first branch (e.g., signal trace portions 118a and 120a) of the signal trace 114 is routed to input 110 and a second branch (e.g., signal trace portions 118b and 120b) of the signal trace 114 is routed to input 112, in order to provide the same output signal to both chips 104 and 106. For example, the signal trace 114 and the first and second branches may each have a characteristic impedance of approximately 60 ohms.

In order to achieve a balanced load, the length of the first branch may be equal to the length of the second branch.

As shown in FIG. 1, the junction 116 is positioned at approximately the midpoint between chip 102, and chips 104, 106, such that the length $L_1$ 130 of signal trace 114 is approximately equal to the length of each branch (e.g., sum of length $L_2$ 132 of portion 118a and length $L_3$ 134 of portion 120a). In order to maintain adequate signal quality through the signal trace 114 and each of the first and second branches, the branches may each include a voltage termination near a respective chip. For example, in the configuration of FIG. 1, a first voltage may be coupled to the signal trace portion 120a (e.g., at the region 126) through a first resistor to form a first $V_{TT}$, and a second voltage may be coupled to the signal trace portion 120b (e.g., at the region 128) through a second resistor to form a second $V_{TT}$. In another example, a third voltage may be coupled to the signal trace 114 (e.g., at the junction 116) through a third resistor to form a third $V_{TT}$ in addition to or in lieu of the previously discussed $V_{TT}$s. For example, the first, second, and third voltages in the previously discussed examples may be the same voltage or different voltages.

The voltage terminations may reduce signal reflections and ringing that may occur in signal trace 114 and/or the first and second branches. Although the voltage terminations may be used to achieve adequate signal quality, it should be noted that the chip 102 may have many additional output drivers for driving additional corresponding inputs in chips 104 and 106. For example, chip 102 may include 15 output drivers for 15 separate address signals and/or 8 output drivers for 8 separate control signals. Therefore, when a voltage termination is applied to each of the signal traces carrying such address and/or control signals from the output drivers of the chip 102 to the corresponding inputs of chips 104 and 106, a substantial amount of area on the PCB 100 may be consumed by the resistors used in the voltage terminations.

Figure 2:
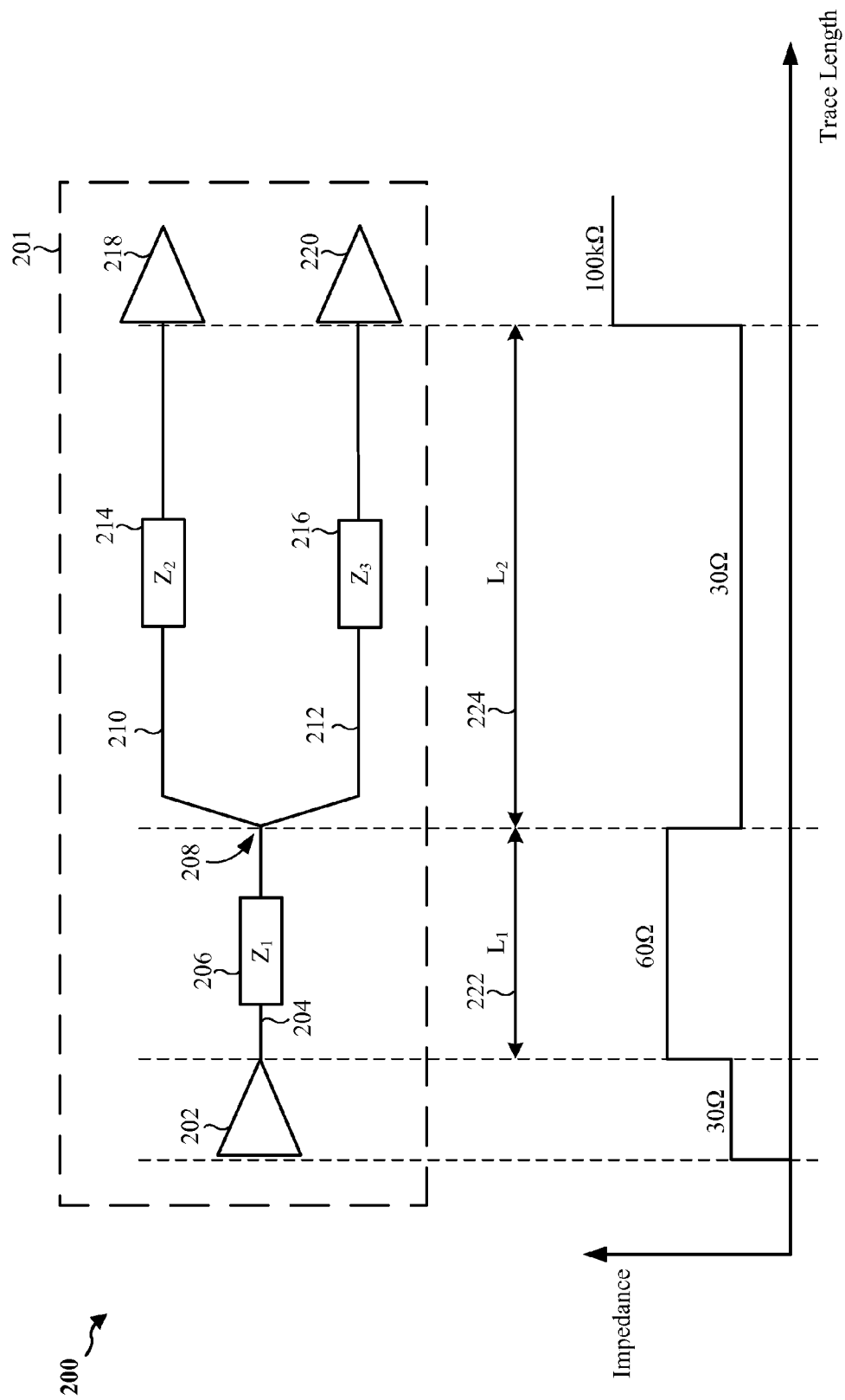
FIG. 2 is a diagram illustrating an exemplary signal trace routing in accordance with various aspects of the disclosure.

FIG. 2 is a diagram illustrating an exemplary signal trace routing 200 in accordance with various aspects of the disclosure. FIG. 2 shows a PCB 201 that includes an output driver 202 configured to drive at least the first and second inputs 218, 220. In an aspect, the output driver 202 may be an address line output of a chip (e.g., SOC) and the first and second inputs 218, 220 may be respective address inputs of memory chips (e.g., DRAM chips). In other aspects, the output driver 202 may be a control line output for transmission of control signals, a clock line output for transmission of clock signals, or an output for transmission of other types of signals on a PCB.

As shown in FIG. 2, signal trace 204 coupled to the output driver 202 branches out at junction 208 to the first signal trace branch 210 and the second signal trace branch 212. The first signal trace branch 210 is coupled to the first input 218 and the second signal trace branch 212 is coupled to the second input 220. Therefore, the signal trace 204 may be a transmission line that serves as an interconnect between the output driver 202 and the first and second signal trace branches 210, 212. The first and second signal trace branches 210, 212 may also be referred to as transmission lines. Accordingly, an output signal from the output driver 202 may be transmitted to first and second inputs 218, 220 via the signal trace 204 and the first and second signal trace branches 210, 212. It should be noted that the configuration of FIG. 2 does not include any voltage terminations.

In FIG. 2, impedance $Z_1$ 206 represents the characteristic impedance of the signal trace 204, impedance $Z_2$ 214 represents the characteristic impedance of the first signal trace branch 210, and impedance $Z_3$ 216 represents the characteristic impedance of the second signal trace branch 212. In an aspect, the impedances $Z_1$ 206, $Z_2$ 214, and $Z_3$ 216 may be of equal values. In another aspect, the impedances $Z_1$ 206, $Z_2$ 214, and $Z_3$ 216 may be different values. In FIG. 2, length $L_1$ 222 represents the length of signal trace 204 and the length $L_2$ 224 represents the length of the first and second signal trace branches 210, 212.

In an aspect, and with reference to the graphical representation of impedance with respect to signal trace length shown in FIG. 2, impedances $Z_1$ 206, $Z_2$ 214, and $Z_3$ 216 may be 60 ohms, and the input impedances of first and second inputs 218, 220 may each be 100K ohms. In such aspect, the equivalent impedance of the first and second signal trace branches 210, 212 may be considered to be 30 ohms (e.g., equivalent impedance=(60 ohms×60 ohms)/(60 ohms+60 ohms)). Therefore, as shown in FIG. 2, the impedance along the signal path from the output driver 202 to the first and second inputs 218, 220 drops from 60 ohms to 30 ohms at junction 208.

In the aspect of FIG. 2, signal reflections that may result in signal trace 204 or the first and second signal trace branches 210, 212 due to the change in impedance at junction 208 may be substantially reduced by configuring the length $L_1$ 222 of the signal trace 204 prior to the junction 208 to be as short as possible. In an aspect, the length $L_2$ 224 of the first and second signal trace branches 210, 212 may be configured to be greater than or equal to 10 times the length $L_1$ 222 of signal trace 204.

In an aspect, the output impedance of the output driver 202 may be configured to match the equivalent impedance (e.g., the effective impedance of a parallel configuration) of the first and second signal trace branches 210 and 212. For example, if the equivalent impedance of the first and second signal trace branches 210 and 212 is 30 ohms, the output impedance of the output driver 202 may be configured to be approximately 30 ohms. In an aspect, the output impedance of the output driver 202 may be configured to be approximately equal to half the characteristic impedance of the first and second signal trace branches 210, 212 in parallel.

In an aspect, the length $L_1$ 222 of the signal trace 204 may be configured to delay the output signal from the output driver 202 less than ⅕ of the rise time of the output signal. The delay time of the output signal (e.g., the propagation time of the signal through a signal trace on a PCB) may be determined using equation (1).

$$\text{Signal delay time} = (\text{Length of signal trace})/(\text{Speed of signal}) \quad \text{(equation 1)}$$

The speed of the signal through a signal trace on a PCB may be determined using equation (2).

$$\text{Speed of signal} = (\text{Speed of light})/\sqrt{\text{Permittivity}} \quad \text{(equation 2)}$$

The permittivity in equation 2 may be the relative permittivity (also referred to as the dielectric constant) of the PCB. For example, the relative permittivity of the PCB may be 4.4. Therefore, by applying equation 2, the speed of the signal on the PCB may be determined to be $(3.0\times10^8 \text{ m/s})/(\sqrt{4.4}) = 1.43\times10^8$ m/s.

It can be appreciated that equation 1 may be applied to determine a length of a signal trace with a particular delay time by solving equation 1 for the length of the signal trace as shown in equation 3.

$$\text{Length of signal trace} = (\text{Signal delay time})\times(\text{Speed of signal}) \quad \text{(equation 3)}$$

Therefore, in one example, if the rise time of the output signal from the output driver 202 is 100 picoseconds (ps)

and if the delay time of the output signal from output driver 202 is to be no more than 1/5 of the rise time (e.g., (100 ps)/5=20 ps), then the length of the signal trace may be determined to be $(2.0\times10^{-11}$ s$)\times(1.43\times10^8$ m/s$)=2.9\times10^{-3}$ m, which is approximately 0.1 inches.

In an aspect, the length $L_1$ 222 of signal trace 204 may have a minimum length of approximately 0.1 inches. In other aspects, the length $L_1$ 222 of signal trace 204 may not be required to have a minimum length. In such aspect, for example, the length $L_1$ 222 of signal trace 204 may be approximately zero.

Figure 3:
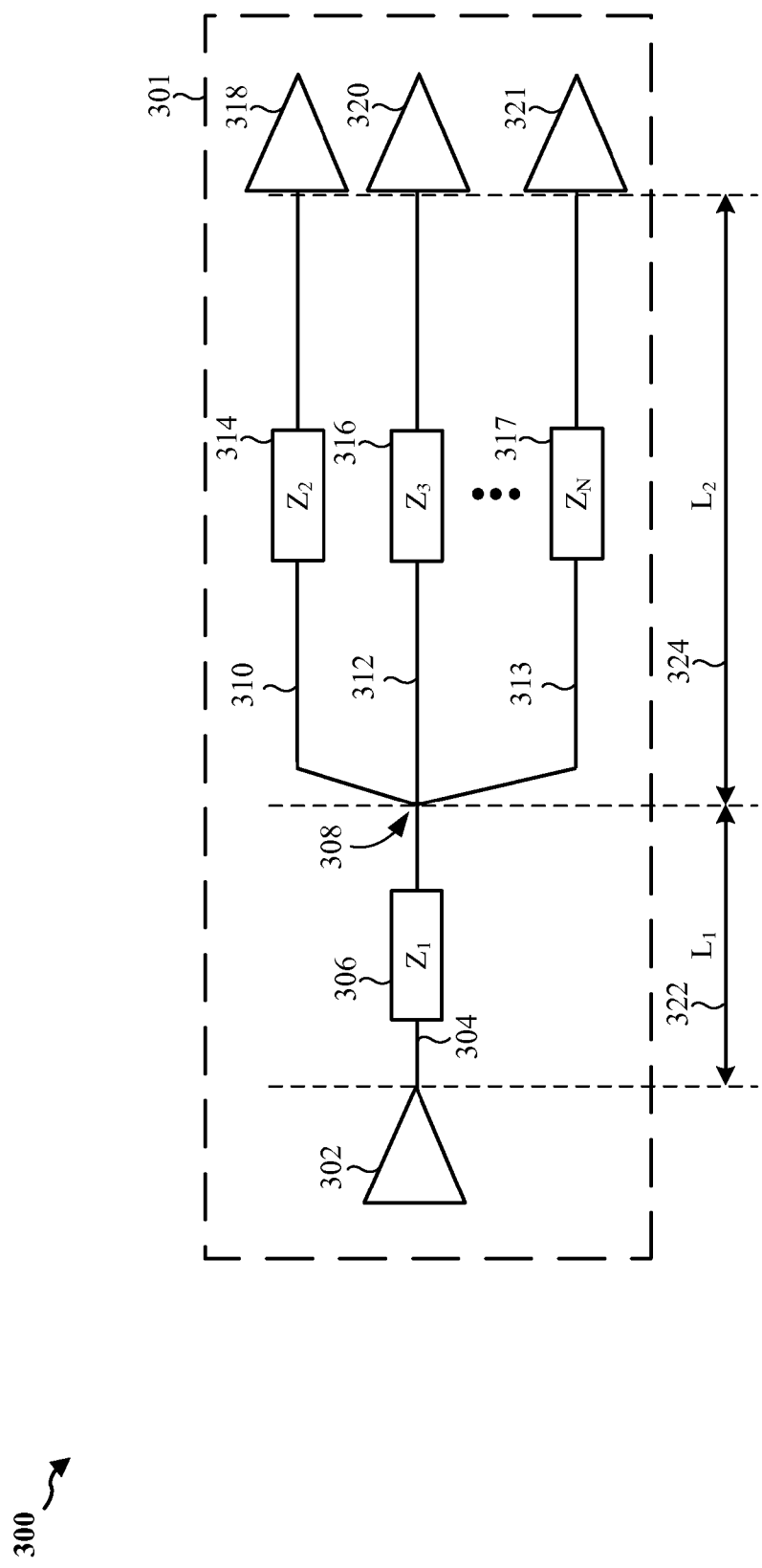
FIG. 3 is a diagram illustrating an exemplary signal trace routing in accordance with various aspects of the disclosure.

It can be appreciated that the aspects described supra may be applied to configurations in which an output driver is to drive more than two inputs. Accordingly, FIG. 3 is a diagram illustrating an exemplary signal trace routing 300 in accordance with various aspects of the disclosure. FIG. 3 shows a PCB 301 that includes an output driver 302 configured to drive three or more inputs, such as the first input 318, second input 320, and the $N^{th}$ input 321. In an aspect, the output driver 302 may be an address line output of a chip (e.g., SOC) and the first, second, and $N^{th}$ inputs 318, 320, and 321 may be respective address inputs of memory chips (e.g., DRAM chips). In other aspects, the output driver 302 may be a control line output for transmission of control signals, a clock line output for transmission of clock signals, or an output for transmission of other types of signals on a PCB.

As shown in FIG. 3, signal trace 304 coupled to the output driver 302 branches out at junction 308 to the first signal trace branch 310, second signal trace branch 312, and the $N^{th}$ signal trace branch 313. The first signal trace branch 310 is coupled to the first input 318, the second signal trace branch 312 is coupled to the second input 320, and the third signal trace branch 313 is coupled to the $N^{th}$ input 321. Therefore, the signal trace 304 may be a transmission line that serves as an interconnect between the output driver 302 and the first, second, and $N^{th}$ signal trace branches 310, 312, 313. The first, second, and $N^{th}$ signal trace branches 310, 312, 313 may also be referred to as transmission lines. Accordingly, an output signal from the output driver 302 may be transmitted to first, second, and $N^{th}$ inputs 318, 320, 321 via the signal trace 304 and the first, second, and $N^{th}$ signal trace branches 310, 312, 313. It should be noted that the configuration of FIG. 3 does not include any voltage terminations, either on the PCB or in the DRAMS 318, 320, 321.

In FIG. 3, impedance $Z_1$ 306 represents the characteristic impedance of the signal trace 304, impedance $Z_2$ 314 represents the characteristic impedance of the first signal trace branch 310, impedance $Z_3$ 316 represents the characteristic impedance of the second signal trace branch 312, and impedance $Z_N$ 317 represents the characteristic impedance of the $N^{th}$ signal trace branch 313. In an aspect, the impedances $Z_1$ 306, $Z_2$ 314, $Z_3$ 316, and $Z_N$ 317 may be of equal values. In another aspect, the impedances $Z_1$ 306, $Z_2$ 314, $Z_3$ 316, and $Z_N$ 317 may be different values. In FIG. 3, length $L_1$ 322 represents the length of the signal trace 304 and length $L_2$ 324 represents the length of the first, second, and $N^{th}$ signal trace branches 310, 312, 313.

In an aspect, impedances $Z_1$ 306, $Z_2$ 314, $Z_3$ 316, and $Z_N$ 317 may be 60 ohms, and the input impedances of inputs 318, 320, and 321 may each be 100K ohms. Accordingly, in such aspect, the equivalent impedance (e.g., in parallel) of the first, second, and $N^{th}$ signal trace branches 310, 312, and 313 may be less than the impedance $Z_1$ 306 of signal trace 304. In the aspect of FIG. 3, the signal reflections that may result in signal trace 304 or the first, second, and $N^{th}$ signal trace branches 310, 312, 313 due to the drop in impedance at junction 308 may be substantially reduced by configuring the length $L_1$ 322 of signal trace 304 prior to the junction 308 to be as short as possible. In an aspect, the length $L_2$ 324 of the first, second, and $N^{th}$ signal trace branches 310, 312, and 313 are configured to be greater than or equal to 10 times the length $L_1$ 322 of signal trace 304.

Figure 4:
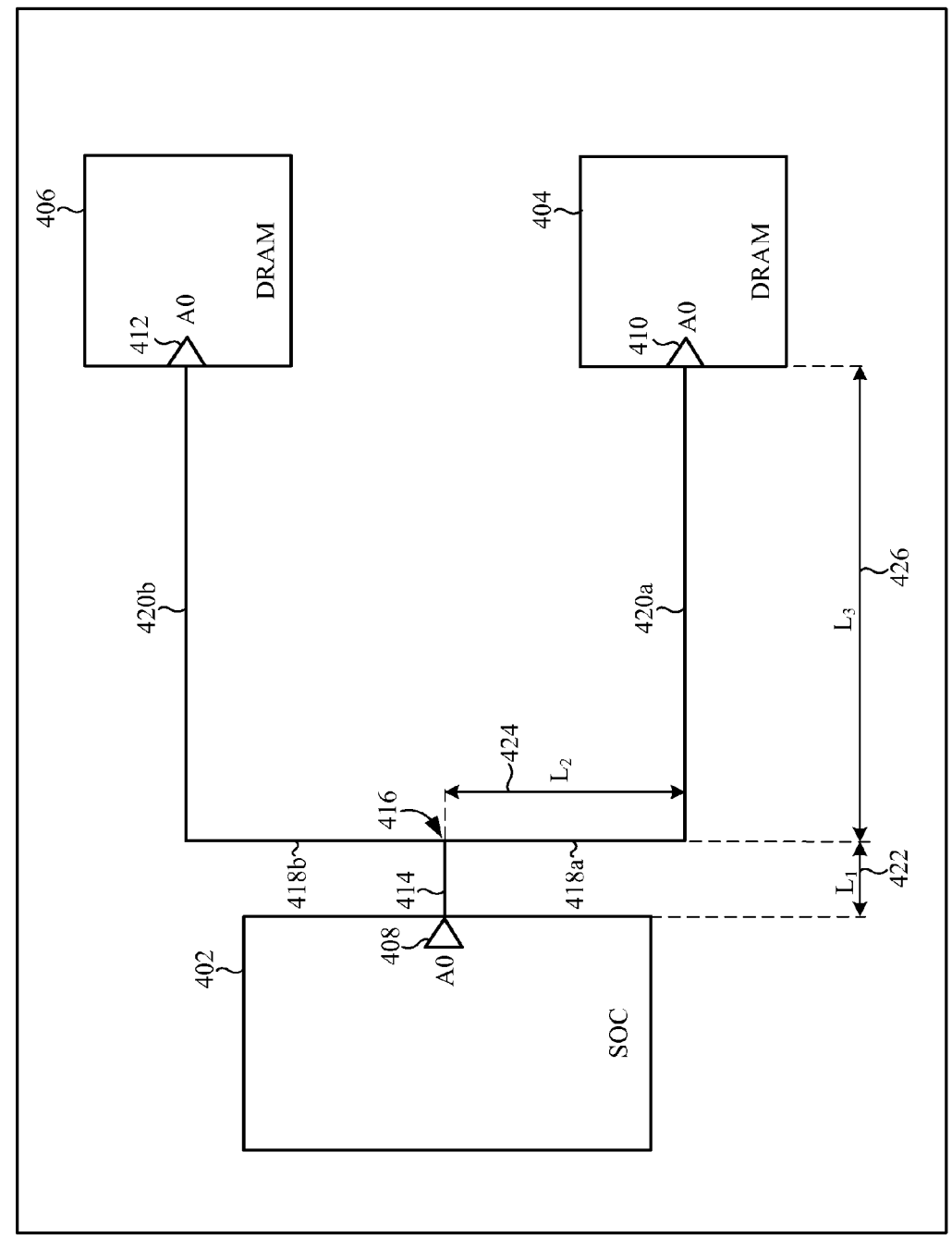
FIG. 4 is a diagram of a PCB illustrating signal routing in accordance various aspects of the disclosure.

FIG. 4 is a diagram of a PCB 400 illustrating signal routing in accordance various aspects of the disclosure. As shown in FIG. 4, PCB 400 includes chips 402, 404, and 406. As further shown in FIG. 4, chip 402 includes an output driver 408, and chips 404 and 406 include respective inputs 410 and 412. For example, chip 402 may be an SOC and chips 404 and 406 may each be a memory chip, such as a DRAM chip. In such example, the output driver 408 of chip 402 may be an address line output (e.g., address line A0) configured to provide an address signal to both inputs 410, 412 of chips 404, 406. Accordingly, and as shown in FIG. 4, the signal trace 414 for carrying the output signal from the output driver 408 is configured to branch out at junction 416, such that a first signal trace branch (e.g., signal trace portions 418a and 420a) of the signal trace 414 is routed to input 410 and a second signal trace branch (e.g., signal trace portions 418b and 420b) of the signal trace 414 is routed to input 412, in order to provide the output signal to both chips 404 and 406. For example, the signal trace 414 and the first and second signal trace branches may each have a characteristic impedance of approximately 60 ohms and the equivalent impedance of the first and second signal trace branches may be considered to be 30 ohms. Therefore, in the example configuration of FIG. 4, the impedance along the signal path from the output driver 408 to the inputs 410, 412 drops from 60 ohms to 30 ohms at junction 416.

In an aspect, signal reflections that may result due to the change in impedance at junction 416 may be reduced by configuring the length $L_1$ 422 of the signal trace 414 prior to the junction 416 to be as short as possible. In an aspect, the length of the first and second signal trace branches may be greater than or equal to 10 times the length $L_1$ 422 of the signal trace 414 (also referred to as an interconnect). For example, the length of first signal trace branch (e.g., the sum of length $L_2$ 424 of signal trace portion 418a and the length $L_3$ 426 of signal trace portion 420a) may be greater than or equal to 10 times the length $L_1$ 422 of the signal trace 414. In an aspect, the length $L_1$ 422 of signal trace 414 may be configured to delay the output signal from the output driver 402 less than 1/5 of the rise time of the output signal.

It should be understood that in the example configuration of FIG. 4, adequate quality of the output signal may be maintained without the use of voltage terminations. Therefore, the resistors that would typically be used in the voltage terminations for the signal traces may be omitted from the PCB, saving considerable area on the PCB. In addition, the cost of such resistors and the costs associated with mounting such resistors on the PCB may also be avoided. Moreover, when a length of a first signal trace branch (e.g., signal trace portions 418a and 420a) and/or a length of a second signal trace branch (e.g., signal trace portions 418b and 420b) is greater than or equal to 10 times the length of an interconnect (e.g., signal trace 414), the relatively short length of the interconnect may reduce signal trace routing congestion on the PCB. Finally, by omitting the resistors used in the voltage terminations and thus saving area on the PCB as previously discussed, signal trace routing congestion on the PCB may be significantly reduced. As such, a lower cost PCB (e.g., a PCB having four layers) may be used rather than a more costly PCB (e.g., a PCB having six or more layers).

In an aspect, an apparatus includes an output driver and a plurality of chips on a PCB. For example, referring back to FIG. 4, PCB 400 includes output driver 408 and chips 402, 404, 406. The chips include a first chip, such as chip 404, and a second chip, such as chip 406. The PCB includes a first transmission line connected to the output driver. For example, with reference to FIG. 2, the first transmission line may be the signal trace 414 coupled to the output driver 408. The PCB further includes a second transmission line connected to the first transmission line and the first chip. For example, with reference to FIG. 2, the second transmission line may be the first signal trace branch (e.g., signal trace portions 418a and 420a). The second transmission line has a length greater than or equal to 10 times a length of the first transmission line. The PCB further includes a third transmission line connected to the first transmission line and the second chip. For example, with reference to FIG. 2, the third transmission line may be the second signal trace branch (e.g., signal trace portions 418b and 420b). The third transmission line has a length greater than or equal to 10 times the length of the first transmission line. In an aspect, the second transmission line connects to the first chip without being coupled to a termination resistor on the PCB and the third transmission line connects to the second chip without being coupled to a termination resistor on the PCB. In an aspect, the output driver is configured to transmit a same signal to the chips. In an aspect, the output driver is configured to transmit the signal on the first transmission line through the second and third transmission lines to the chips, the signal being one of a control signal, a clock signal, or an address signal. In an aspect, the length of the first transmission line is configured to delay the signal less than ⅕ a rise time of the signal. In an aspect, a characteristic impedance of the second transmission line and the third transmission line is equal to a characteristic impedance of the first transmission line. In an aspect, an output impedance of the output driver is approximately equal to a characteristic impedance of the second and third transmission lines in parallel. In an aspect, an output impedance of the output driver is approximately equal to half the characteristic impedance of the second transmission line or the third transmission line.

Figure 5:
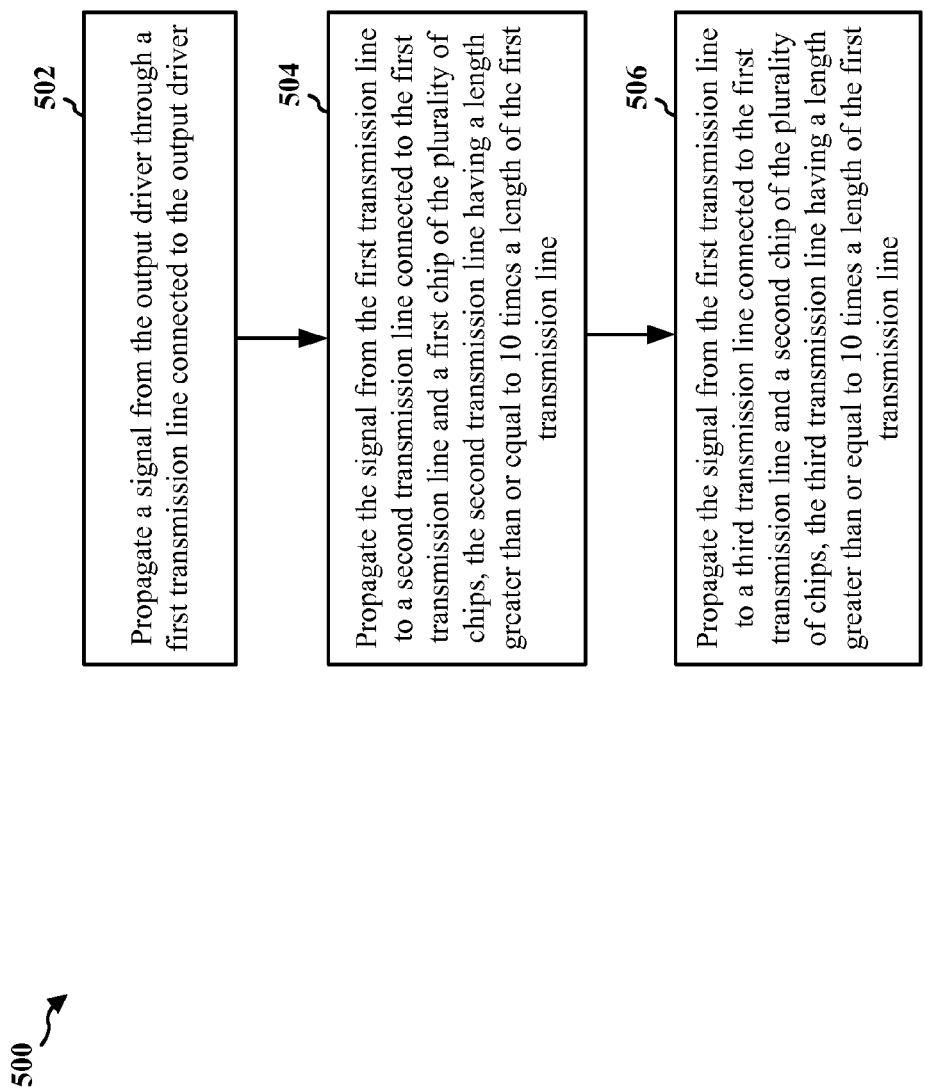
FIG. 5 is a flow chart of a method of propagating a signal from an output driver on a PCB to a plurality of chips on the PCB.

FIG. 5 is a flow chart 500 of a method of propagating a signal from an output driver on a PCB to a plurality of chips on the PCB. At step 502, a signal is propagated from the output driver through a first transmission line connected to the output driver. For example, with reference to FIG. 2, the output driver may be output driver 202 and the first transmission line may be signal trace 204. For example, the signal may be a control signal, a clock signal, or an address signal. In an aspect, the signal is delayed through the first transmission line by less than ⅕ a rise time of the signal.

At step 504, the signal is propagated from the first transmission line to a second transmission line connected to the first transmission line and a first chip of the plurality of chips, the second transmission line having a length greater than or equal to 10 times a length of the first transmission line. For example, with reference to FIG. 2, the second transmission line may be the signal trace branch 210 and the first chip may be a first memory chip (e.g., a DRAM chip) that includes the first input 218. Accordingly, the length $L_2$ 224 of the signal trace branch 210 may be greater than or equal to 10 times the length $L_1$ 222 of signal trace 204. In an aspect, the second transmission line connects to the first chip without being coupled to a termination resistor on the PCB.

At step 506, the signal is propagated from the first transmission line to a third transmission line connected to the first transmission line and a second chip of the plurality of chips, the third transmission line having a length greater than or equal to 10 times a length of the first transmission line. For example, with reference to FIG. 2, the third transmission line may be the signal trace branch 212 and the second chip may be a second memory chip (e.g., a DRAM chip) that includes the second input 220. Accordingly, the length $L_2$ 224 of the signal trace branch 212 may be greater than or equal to 10 times the length $L_1$ 222 of signal trace 204. In an aspect, the third transmission line connects to the second chip without being coupled to a termination resistor on the PCB. In an aspect, the signal through the second transmission line and the signal through the third transmission line carry the same information as the signal through the first transmission line. For example, the signal through the first transmission line may be configured to carry memory address information. In such example, the signal through the second transmission line and the signal through the third transmission line may each carry the same memory address information as the signal through the first transmission line. In an aspect, a characteristic impedance of the second transmission line and the third transmission line is equal to a characteristic impedance of the first transmission line. In an aspect, the output impedance of the output driver is approximately equal to a characteristic impedance of the first and second transmission lines in parallel.

In one configuration, an apparatus for propagating a signal on a PCB includes means for driving a signal to a plurality of chips. For example, with reference to FIG. 2, the means for driving the signal may be the output driver 202. The apparatus further includes first means for propagating the signal from the means for driving the signal, the first means connected to the means for driving the signal. For example, the first means for propagating the signal may be the first transmission line, such as the signal trace 204 coupled to the output driver 202. The apparatus further includes second means for propagating the signal from the first means, the second means connected to the first means and a first chip of a plurality of chips, the second means having a length greater than or equal to 10 times a length of the first means. For example, the second means for propagating the signal may be the second transmission line, such as the signal trace branch 210. In such example, the length $L_2$ 224 of the signal trace branch 210 may be greater than or equal to 10 times the length $L_1$ 222 of signal trace 204. The apparatus further includes third means for propagating the signal from the first means, the third means connected to the first means and a second chip of the plurality of chips, the third means having a length greater than or equal to 10 times a length of the first means. For example, the third means for propagating the signal may be the third transmission line, such as the signal trace branch 212. In such example, the length $L_2$ 224 of the signal trace branch 212 may be greater than or equal to 10 times the length $L_1$ 222 of signal trace 204. For example, the signal may be a control signal, a clock signal, or an address signal.

The second means connects to the first chip without being coupled to a termination resistor on the PCB and the third means connects to the second chip without being coupled to a termination resistor on the PCB. The signal through the second means and the signal through the third means may carry the same information as the signal through the first means. For example, the signal through the first means may be configured to carry memory address information. In such example, the signal through the second means and the signal through the third means may each carry the same memory address information as the signal through the first means. The signal may be delayed through the first means by less than ⅕ a rise time of the signal. The characteristic impedance of the second means and the third means may be equal to a characteristic impedance of the first means. In an aspect, the output impedance of the means for driving the signal may be approximately equal to a characteristic impedance of the first and second means in parallel. In another aspect, the output impedance of the means for driving the signal is approximately equal to half the characteristic impedance of the first means or the second means.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus comprising:
    an output driver on a printed circuit board (PCB); and
    a plurality of chips on the PCB, the chips including a first chip and a second chip, the PCB comprising:
        a first transmission line connected to the output driver;
        a second transmission line connected to the first transmission line and the first chip, the second transmission line having a length greater than or equal to 10 times a length of the first transmission line; and
        a third transmission line connected to the first transmission line and the second chip, the third transmission line having a length greater than or equal to 10 times the length of the first transmission line,
        so as to cause a reduction in reflections of a signal driven from the output driver due to a change in impedance at a junction of the first transmission line, the second transmission line, and the third transmission line.

2. The apparatus of claim 1, wherein the second transmission line connects to the first chip without being coupled to a termination resistor on the PCB and the third transmission line connects to the second chip without being coupled to a termination resistor on the PCB.

3. The apparatus of claim 1, wherein the output driver is configured to transmit a same signal to the chips.

4. The apparatus of claim 3, wherein the output driver is configured to transmit the signal on the first transmission line through the second and third transmission lines to the chips, the signal being one of a control signal, a clock signal, or an address signal.

5. The apparatus of claim 3, wherein the length of the first transmission line is configured to delay the signal less than ⅕ a rise time of the signal.

6. The apparatus of claim 1, wherein a characteristic impedance of the second transmission line and the third transmission line is equal to a characteristic impedance of the first transmission line.

7. The apparatus of claim 1, wherein an output impedance of the output driver is approximately equal to a characteristic impedance of the second and third transmission lines in parallel.

8. The apparatus of claim 1, wherein an output impedance of the output driver is approximately equal to half the characteristic impedance of the second transmission line or the third transmission line.

9. An apparatus for propagating a signal on a printed circuit board (PCB), comprising:
    means for driving a signal to a plurality of chips;
    first means for propagating the signal from the means for driving the signal, the first means connected to the means for driving the signal;
    second means for propagating the signal from the first means, the second means connected to the first means and a first chip of a plurality of chips, the second means having a length greater than or equal to 10 times a length of the first means; and
    third means for propagating the signal from the first means, the third means connected to the first means and a second chip of the plurality of chips, the third means having a length greater than or equal to 10 times a length of the first means,
    so that there is a reduction in reflections of the signal due to a change in impedance at a junction of the first means, the second means, and the third means.

10. The apparatus of claim 9, wherein the second means connects to the first chip without being coupled to a termination resistor on the PCB and the third means connects to the second chip without being coupled to a termination resistor on the PCB.

11. The apparatus of claim 9, wherein the signal through the second means and the signal through the third means carry same information as the signal through the first means.

12. The apparatus of claim 11, wherein the signal is one of a control signal, a clock signal, or an address signal.

13. The apparatus of claim 11, wherein the signal is delayed through the first means by less than ⅕ a rise time of the signal.

14. The apparatus of claim 9, wherein a characteristic impedance of the second means and the third means is equal to a characteristic impedance of the first means.

15. The apparatus of claim 9, wherein an output impedance of the means for driving the signal is approximately equal to a characteristic impedance of the first and second means in parallel.

16. The apparatus of claim 9, wherein an output impedance of the means for driving the signal is approximately equal to half the characteristic impedance of the first means or the second means.

* * * * *